United States Patent
Lunning et al.

(10) Patent No.: US 6,933,620 B2
(45) Date of Patent: Aug. 23, 2005

(54) SEMICONDUCTOR COMPONENT AND METHOD OF MANUFACTURE

(75) Inventors: Scott Lunning, Dresden (DE); Karsten Wieczorek, Am Schulfeld (DE); Thorsten Kammler, Buchenstrasse (DE)

(73) Assignee: Advanced Micro Devices, Inc., Sunnyvale, CA (US)

(*) Notice: Subject to any disclaimer, the term of this patent is extended or adjusted under 35 U.S.C. 154(b) by 0 days.

(21) Appl. No.: 10/915,638

(22) Filed: Aug. 9, 2004

(65) Prior Publication Data

US 2005/0009285 A1 Jan. 13, 2005

Related U.S. Application Data

(62) Division of application No. 10/236,200, filed on Sep. 6, 2002, now Pat. No. 6,806,126.

(51) Int. Cl.[7] .............................................. H01L 27/088
(52) U.S. Cl. ........................................................ 257/900
(58) Field of Search ............................. 438/267, 286, 438/304, 154, 143, 962, 217; 257/24, 350, 351

(56) References Cited

U.S. PATENT DOCUMENTS

| | | |
|---|---|---|
| 5,753,967 A | 5/1998 | Lin |
| 5,783,479 A | 7/1998 | Lin et al. |
| 5,879,999 A * | 3/1999 | Park et al. ................. 438/304 |
| 5,920,783 A | 7/1999 | Tseng et al. |
| 6,027,975 A | 2/2000 | Hergenrother et al. |
| 6,194,279 B1 | 2/2001 | Chen et al. |
| 6,291,354 B1 | 9/2001 | Hsiao et al. |
| 6,465,294 B1 * | 10/2002 | Tsai et al. ................. 438/217 |
| 6,548,862 B2 | 4/2003 | Ryu et al. |
| 6,770,516 B2 * | 8/2004 | Wu et al. ................... 438/154 |
| 2002/0066935 A1 | 6/2002 | Shimizu et al. |

FOREIGN PATENT DOCUMENTS

WO 01/88991 11/2001

* cited by examiner

Primary Examiner—David Nelms
Assistant Examiner—Mai-Huong Tran
(74) Attorney, Agent, or Firm—Rennie Wm. Dover; Paul Drake

(57) ABSTRACT

An insulated gate semiconductor device (100) having reduced gate resistance and a method for manufacturing the semiconductor device (100). A gate structure (112) is formed on a major surface (104) of a semiconductor substrate (102). Successive nitride spacers (118, 128) are formed adjacent the sidewalls of the gate structure (112). The nitride spacers (118, 128) are etched and recessed using a single etch to expose the upper portions (115A, 117A) of the gate structure (112). Source (132) and drain (134) regions are formed in the semiconductor substrate (102). Silicide regions (140, 142, 144) are formed on the top surface (109) and the exposed upper portions (115A, 117A) of the gate structure (112) and the source region (132) and the drain region (134). Electrodes (150, 152, 154) are formed in contact with the silicide (140, 142, 144) of the respective gate structure (112), source region (132), and the drain region (134).

20 Claims, 2 Drawing Sheets

SEMICONDUCTOR COMPONENT AND METHOD OF MANUFACTURE

This is a divisional application of Application No. 10/236,200. now U.S. Pat. No. 6,809,126 filed Sep. 6, 2002. by Scott Luning et al., assigned to the same assignee, and titled "SEMICONDUCTOR COMPONENT AND METHOD OF MANUFACTURE."

FIELD OF THE INVENTION

This invention relates, in general, to semiconductor components and, more particularly, to the gate resistance of semiconductor components.

BACKGROUND OF THE INVENTION

Semiconductor device manufacturers are constantly improving device performance while lowering their cost of manufacture. One way manufacturers have reduced costs has been to shrink the sizes of the devices so that more devices can be made from a single semiconductor wafer. However, in reducing the device sizes other factors arise that limit their performance. For example, as the semiconductor devices are made smaller or shrunk, the source-drain breakdown voltage decreases, junction capacitance increases, and the threshold voltage becomes unstable. Collectively, these adverse performance effects are referred to as short channel effects. Typical techniques for mitigating short channel effects rely on adjusting the electric field in the channel region to minimize the peak lateral electric field of the drain depletion region.

In addition to increasing device density, shrinking semiconductor device sizes decreases their gate width, which in turn reduces their channel lengths and improves transistor performance. However, as the gate width is decreased, it becomes increasingly difficult to form silicide on the gate structures. The inadequate formation of silicide results in an increase in the gate resistance. Because silicide lowers gate resistance and improves transistor performance, it is desirable to efficiently and reliably form silicide on the gate structures. FIG. 1 is a cross-sectional side view of a portion of a prior art semiconductor component 10 during an intermediate stage of manufacture. What is shown in FIG. 1 is a semiconductor substrate 12 having a major surface 14. A gate structure 16 comprising a gate oxide 18 and a gate 20 having sidewalls 22 is disposed on major surface 14. Semiconductor component 10 includes a source extension region 24, a drain extension region 26, a source region 28, and a drain region 30. Oxide spacers 32 are formed adjacent sidewalls 22 and nitride spacers 34 are formed adjacent oxide spacers 32. Oxide spacers 32 offset the extension implants that form source and drain extension regions 24 and 26, respectively, from gate sidewalls 22. Nitride spacers 34 offset the deep source and drain regions 28 and 30, respectively, from the respective source and drain extension regions 24 and 26. A layer of refractory metal 36 is formed on gate 20, source region 28, and drain region 30. As those skilled in the art are aware, silicide is formed from the portions of the source and drain regions 28 and 30, respectively, and the portion of gate 20 that are in contact with refractory metal layer 36. With respect to gate 20, spacers 32 and 34 limit formation of silicide to its top surface. Because gate resistance is dependent upon the amount of gate surface area available for silicide formation, limiting the amount of available gate surface area for silicide formation limits the ability to lower the gate resistance.

Accordingly, what is needed is a semiconductor component having narrow gate widths and a method for manufacturing these semiconductor components which allows sufficient silicide formation so that the gate resistance remains low.

SUMMARY OF THE INVENTION

The present invention satisfies the foregoing need by providing a semiconductor component and a method for manufacturing the semiconductor component that provides sufficient gate silicon for silicide formation to reduce gate resistance. In accordance with one aspect, the present invention comprises a method for forming a semiconductor component in which a gate structure having first and second sides and a top surface is formed on a semiconductor material of a first conductivity type. First and second nitride spacers are formed adjacent the first and second sides of the gate structure. A first doped region and a second doped region are formed in the semiconductor material, wherein the first and second doped regions are aligned to the first and second nitride spacers. A layer of nitride is disposed over the first and second nitride spacers and the gate structure. The layer of nitride is anisotropically etched to form third and fourth nitride spacers adjacent the first and second nitride spacers, respectively. The layer of nitride is overetched to expose portions of the first and second sidewalls and the top surface of the gate structure. A third doped region and a fourth doped region are formed in the semiconductor material, wherein the third and fourth doped regions are aligned to the third and fourth spacers, respectively. Silicide is formed along portions of the first and second sides of the gate structure, on the top surface of the gate structure, and in the third and fourth doped regions.

In accordance with another aspect, the present invention includes a semiconductor component comprising a semiconductor material having a gate structure formed thereon. The gate structure has a top surface and first and second sides. A pair of spacers are adjacent the first side of the gate structure such that the spacers cover a portion of the first side of the gate structure and a pair of spacers are adjacent the second side of the gate structure such that the spacers cover a portion of the second side of the gate structure. Silicide is formed along the portions of the first and second sides of the gate structure not covered by the spacers as well as on the top surface of the gate structure. Because silicide is formed along the first and second sides of the gate structure as well as the top surface, the gate resistance is lowered.

BRIEF DESCRIPTION OF THE DRAWINGS

The present invention will be better understood from a reading of the following detailed description, taken in conjunction with the accompanying drawing figures in which like references designate like elements and in which.

DETAILED DESCRIPTION

Generally, the present invention provides a semiconductor component and a method for manufacturing the semiconductor component such as an insulated gate semiconductor device or field effect transistor. In accordance with an embodiment of the present invention, a pair of spacers are formed adjacent each side of a gate structure, wherein the spacers are comprised of the same material. Because the material of the spacers is the same, they can be recessed using a single etch technique. Recessing the spacers increases the amount of gate polysilicon surface available for silicide formation, thereby decreasing the gate resistance and improving device performance.

Figure 1:
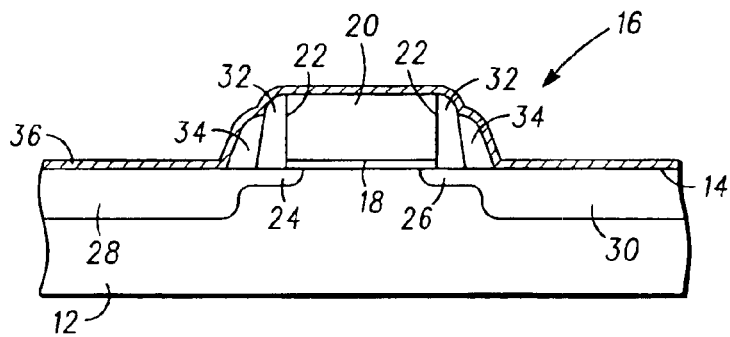
FIG. 1 is a highly enlarged cross-sectional side view of a portion of a prior art semiconductor component during manufacture.
Figure 2:
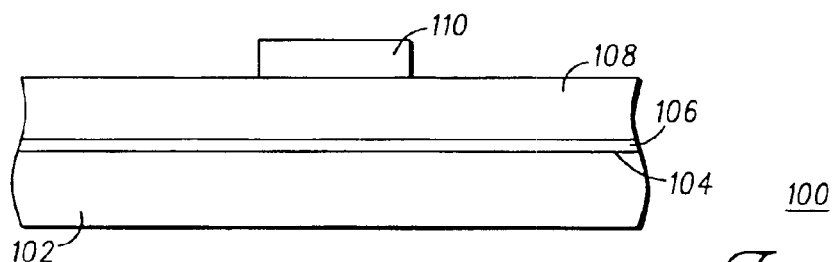
FIGS. 2–8 are highly enlarged cross-sectional side views of a portion of an insulated gate semiconductor component in accordance with an embodiment of the present invention.

FIG. 2 is an enlarged cross-sectional view of a portion of a partially completed insulated gate field effect transistor 100 during beginning processing steps in accordance with an embodiment of the present invention. What is shown in FIG. 2 is a semiconductor substrate 102 of P-type conductivity having a major surface 104. By way of example, semiconductor substrate 102 is silicon having a <100> crystal orientation and a P-type dopant concentration on the order of $1 \times 10^{16}$ ions per cubic centimeter (ions/cm$^3$). Alternatively, semiconductor substrate 102 may be comprised of a heavily doped silicon wafer having a <100> crystal orientation and a lightly doped epitaxial layer disposed thereon. Other suitable materials for substrate 102 include silicon, silicon germanium, germanium, Silicon-On-Insulator (SOI), and the like. The conductivity type of substrate 102 is not a limitation of the present invention. In accordance with the present embodiment, the conductivity type is chosen to form an N-channel insulated gate semiconductor device. However, the conductivity type can be selected to form a P-channel insulated gate semiconductor device or a complementary insulated gate semiconductor device, e.g., a Complementary Metal Oxide Semiconductor (CMOS) device.

A layer of dielectric material 106 is formed on major surface 104. Dielectric layer 106 serves as a gate dielectric material and may be formed by techniques known to those skilled in the art including thermal oxidation, chemical vapor deposition, and the like. By way of example, layer 106 has a thickness ranging from approximately 10 Angstroms (Å) to approximately 100 Å. A layer of polysilicon 108 is formed on dielectric layer 106 using, for example, a chemical vapor deposition technique. A suitable range of thicknesses for polysilicon layer 108 is between approximately 1,000 Å and approximately 2,000 Å. A layer of photoresist is deposited on polysilicon layer 108 and patterned to form an etch mask 110. Techniques for depositing and patterning photoresist are well known to those skilled in the art.

Figure 3:
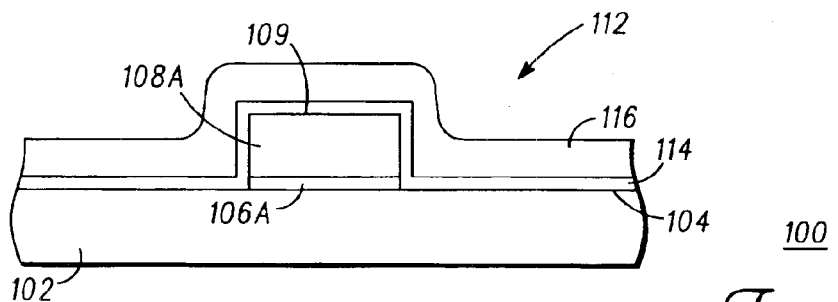

Referring now to FIG. 3, polysilicon layer 108 is etched using an etch chemistry that preferentially etches polysilicon, i.e., an etch chemistry selective to polysilicon. By way of example, polysilicon layer 108 is etched using anisotropic Reactive Ion Etching (RIE) and an etchant species that is selective to polysilicon. Methods for etching polysilicon are well known to those skilled in the art. After removal of the exposed portions of polysilicon layer 108, the etch chemistry is changed to anisotropically etch oxide layer 106. The anisotropic etching of oxide layer 106 stops at major surface 104. Then etch mask layer 110 is removed. The remaining portions 108A and 106A of polysilicon layer 108 and dielectric layer 106, respectively, form a gate structure 112 having sides 115 and 117 and a top surface 109. Portion 108A serves as a gate conductor and portion 106A serves as a gate oxide.

Still referring to FIG. 3, an oxide layer 114 is formed on gate structure 112 and the exposed portions of major surface 104. Techniques for forming oxide layer 114 include deposition techniques such as, for example, chemical vapor deposition and growth techniques such as oxidization of gate conductor 108A and silicon 102. Preferably, oxide layer 114 has a thickness of less than 100 Å and even more preferably a thickness ranging between approximately 10 Å and approximately 60 Å. A layer of silicon nitride 116 having a thickness ranging between approximately 50 Å and 300 Å is formed on oxide layer 114. Oxide layer 114 serves as a buffer layer between major surface 104 and nitride layer 116 and between the surfaces of gate conductor 108A and silicon nitride layer 116.

Figure 4:
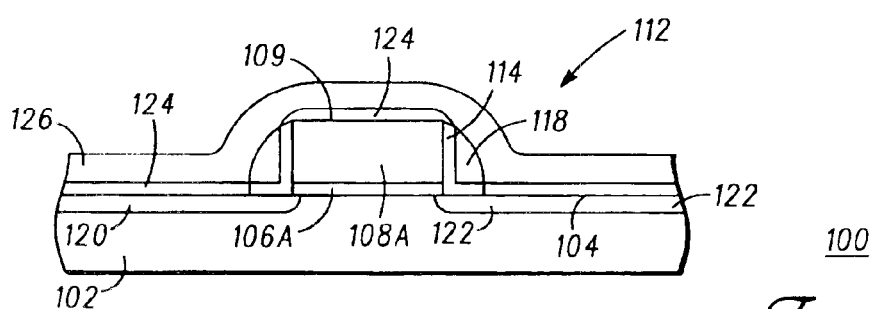

Referring now to FIG. 4, silicon nitride layer 116 is anisotropically etched using an etch selective to silicon nitride to form extension implant spacers 118 and to expose oxide layer 114. Preferably, the etch chemistry is changed to be selective to oxide, and oxide layer 114 is anisotropically etched to expose major surface 104. The portions of oxide layer 114 between extension implant spacers 118 and the sidewalls of gate structure 112 and between extension implant spacers 118 and the portions of major surface 104 laterally adjacent the sidewalls of gate structure 112 remain, i.e., they are not removed.

An impurity material of N-type conductivity such as for, example, arsenic, is implanted into semiconductor material 102 to form doped regions 120 and 122, which serve as source and drain extensions, respectively. By way of example, doped regions 120 and 122 have a concentration ranging from approximately $1 \times 10^{18}$ ions/cm$^3$ to approximately $5 \times 10^{20}$ ions/cm$^3$ and vertically extend approximately 0.01 micrometers ($\mu$m) to 0.05 $\mu$m into semiconductor material 102. Suitable implant parameters for forming the source and drain extension regions include a zero degree implant having a dose ranging between approximately $1 \times 10^{14}$ ions per square centimeter (ions/cm$^2$) and approximately $1 \times 10^{16}$ ions/cm$^2$ and an implant energy ranging between approximately 1 kilo electron-Volt and approximately 10 kilo electron-Volts (keV). However, it should be understood that the implant is not limited to a zero degree implant and that a non-zero degree or tilted implant may be used to form source and drain extension regions 120 and 122, respectively. The doped semiconductor material is annealed by heating to a temperature ranging between approximately 800 degrees Celsius (° C.) and 1,100° C. Annealing semiconductor 100 causes the dopant to diffuse in both the vertical and lateral directions. Thus, the N-type dopant of source extension region 120 diffuses under gate structure 112 from side 115 and the N-type dopant of drain extension region 122 diffuses under gate structure 112 from side 117.

Still referring to FIG. 4, an oxide layer 124 is grown on gate structure 112, extension implant spacers 118, and the exposed portions of major surface 104. By way of example, oxide layer 124 is thermally grown in an oxidizing ambient such as for example dry oxygen at a temperature ranging between approximately 750° C. and approximately 900° C. Growing oxide layer 124 under these conditions allows controllably growing the oxide on silicon substrate 102, while forming only a negligible amount of oxide on extension implant spacers 118, i.e., on silicon nitride. Because the amount of oxide formed on extension implant spacers 118 is negligible, oxide layer 124 is not shown over spacers 118. Preferably, oxide layer 124 has a thickness ranging between approximately 30 Å and approximately 60 Å on gate structure 112 and silicon substrate 102 and substantially 0 Å on spacers 118. A layer of silicon nitride 126 having a thickness ranging between approximately 600 Å and approximately 1,500 Å is formed on oxide layer 124.

Figure 5:
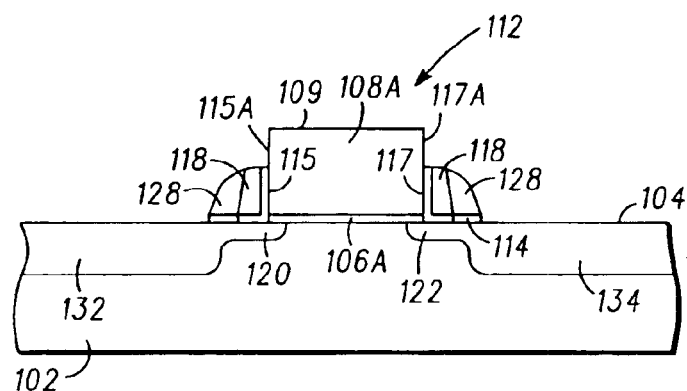

Referring now to FIG. 5, silicon nitride layer 126 is anisotropically etched using an etch selective to silicon nitride to form spacers 128 and to expose oxide layer 124. An overetch is performed to recess spacers 128 and 118 and thereby expose the upper portions 115A and 117A of sidewalls 115 and 117, respectively, of gate conductor 108A. Because oxide layer 114 is very thin and a negligible amount of oxide is formed on extension implant spacers 118 during the formation of oxide layer 124, the anisotropic etch forming spacers 128 readily etches oxide layer 114 and any oxide formed on extension implant spacers 118. An advantage of spacers 128 and 118 being made of the same material, e.g., silicon nitride, is that they can be recessed using a single etch process, thereby saving time and lowering the cost and complexity of manufacturing the spacers.

A source/drain implant is performed to form a source region 132 and a drain region 134. The source/drain implant also dopes gate structure 112. A suitable set of parameters for the source/drain implant includes implanting an N-type impurity material such as, for example, phosphorus at a dose ranging between approximately $1 \times 10^{14}$ ions/cm$^2$ and approximately $1 \times 10^{16}$ ions/cm$^2$ and using an implant energy ranging between approximately 20 keV and approximately 120 keV. The doped semiconductor material is annealed by heating to a temperature between approximately 800° C. and 1,100° C. Annealing semiconductor 100 causes the dopant to diffuse in both the vertical and lateral directions.

Although the formation of source/drain extension regions has been described as being formed before the formation of oxide layer 124, it should be understood this is not a limitation of the present invention. For example, the source/drain extension regions may be formed after the formation of oxide layer 124. Likewise, halo implants may be performed either before or after the formation of oxide layer 124.

Figure 6:
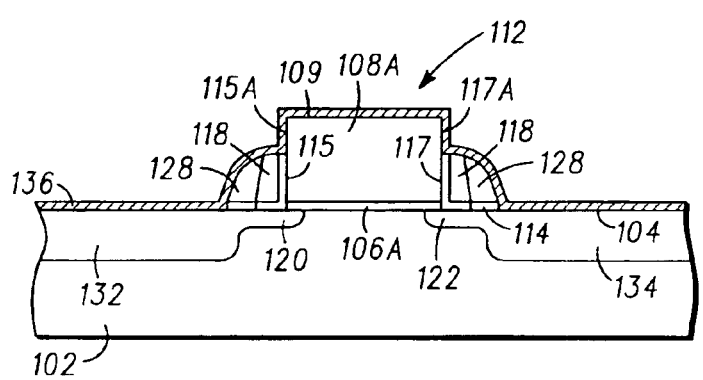

Referring now to FIG. 6, an optional wet etch is performed to remove any oxide along top surface 109 of gate conductor 108A and along upper portions 115A and 117A of the respective sidewalls 115 and 117. In addition, the wet etch removes portions of oxide layer 124 disposed on major surface 104. A layer 136 of refractory metal is conformally deposited on top surface 109 and upper portions 115A and 117A of gate conductor 108A, spacers 118 and 128, and the exposed portions of silicon surface 104. By way of example, the metal of layer 136 is cobalt having a thickness ranging between approximately 50 Å and 300 Å.

Figure 7:
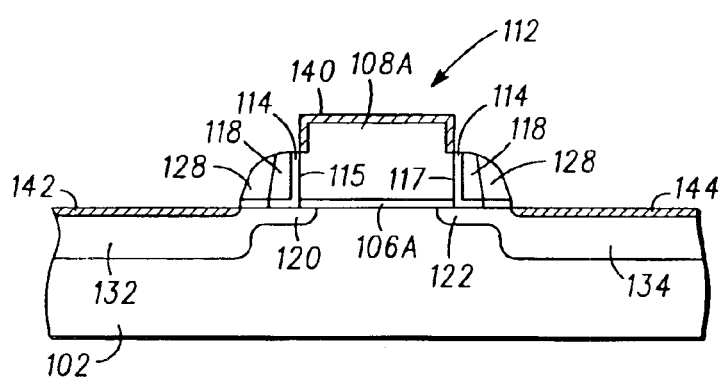

Referring now to FIG. 7, refractory metal layer 136 is heated to a temperature ranging between approximately 600° C. and 700° C. The heat treatment causes the cobalt to react with the silicon to form cobalt silicide (CoSi) in all regions in which the cobalt is in contact with silicon. Thus, cobalt silicide 140 is formed from gate conductor 108A, cobalt silicide 142 is formed from source region 132, and cobalt silicide 144 is formed from drain region 134. In accordance with an embodiment of the present invention, cobalt silicide is not only formed on top surface 109 of gate 108, but also on upper portions 130 of gate 108, thereby increasing the amount of silicide formed on gate 108 and lowering the gate resistance without increasing the gate width. The portions of the cobalt adjacent silicon nitride spacers 118 and 128 remain unreacted. It should be understood that the type of silicide is not a limitation of the present invention. For example, other suitable silicides include titanium silicide (TiSi), platinum silicide (PtSi), nickel silicide (NiSi), and the like. As those skilled in the art are aware, silicon is consumed during the formation of silicide and the amount of silicon consumed is a function of the type of silicide being formed.

Still referring to FIG. 7, the unreacted cobalt is removed using processes known to those skilled in the art. Removing the unreacted cobalt electrically isolates gate conductor 108A, source region 132, and drain region 134 from each other.

Figure 8:
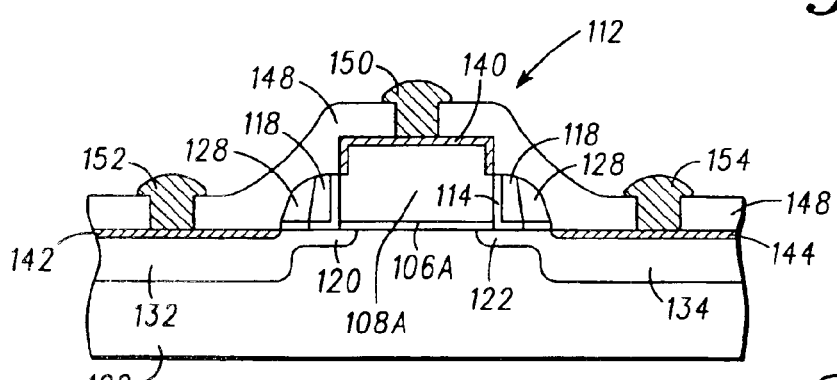

Referring now to FIG. 8, a layer of dielectric material 148 is formed on the silicided regions and the spacers. By way of example, dielectric material 148 is oxide having a thickness ranging between approximately 500 Å and 2,000 Å. Openings are formed in oxide layer 148 to expose portions of silicide layers 140, 142, and 144. Using techniques well known in the art, electrical conductors or electrodes are formed which contact the exposed silicide layers 140, 142, and 144. More particularly, a gate electrode 150 contacts gate silicide 140, a source electrode 152 contacts source silicide layer 142, and a drain electrode 154 contacts drain silicide layer 144.

By now it should be appreciated that an insulated gate semiconductor component and a method for manufacturing the semiconductor component have been provided. In accordance with the present invention, the amount of polysilicon available for silicide formation is increased by forming a succession of spacers along each sidewall of the gate conductor, wherein the spacers were formed from the same material. Because the spacers are made from the same material and are separated by an intervening layer having a negligible thickness, they can be recessed using a single etch process, thereby increasing the amount of exposed gate material for silicide formation. The increased silicide formation reduces the gate resistance and improves the performance of the semiconductor components. The use of a single etch process to recess the sidewall spacers makes a more robust process and lowers the cost of manufacturing the semiconductor components.

Although certain preferred embodiments and methods have been disclosed herein, it will be apparent from the foregoing disclosure to those skilled in the art that variations and modifications of such embodiments and methods may be made without departing from the spirit and scope of the invention. For example, the method is applicable to both asymmetric and symmetric semiconductor devices. In addition, the present invention is suitable for manufacturing N-channel semiconductor devices, P-channel semiconductor devices, and complementary semiconductor devices.

What is claimed is:

1. A semiconductor component, comprising:
    a semiconductor material of a first conductivity type and having a major surface;
    a gate structure over a portion of the major surface, the gate structure having a top surface and first and second sides;
    a first nitride spacer adjacent the first side of the gate structure, the first nitride spacer spaced apart from the gate structure by an oxide layer having a thickness of less than 100 Angstroms;
    a first doped region in the semiconductor material and aligned to the first nitride spacer;
    a second nitride spacer adjacent the first nitride spacer;
    a second doped region in the semiconductor material and aligned to the second nitride spacer; and
    a third doped region in the semiconductor material and aligned to the second side of the gate structure.

2. The semiconductor component of claim 1, further comprising a third nitride spacer adjacent the second side of the gate structure, the third nitride spacer spaced apart from the gate structure by the oxide layer having a thickness less than 100 Angstroms.

3. The semiconductor component of claim 2, further including a fourth nitride spacer adjacent the third nitride spacer.

4. The semiconductor component of claim 3, further including silicide along a portion of the first side and a portion of the second side of the gate structure and silicide on the top surface of the gate structure.

5. The semiconductor component of claim 4, wherein the first nitride spacer is spaced apart from the second nitride spacer by a first portion of a thermally grown oxide layer and wherein the third nitride spacer is spaced apart from the fourth nitride spacer by a second portion of the thermally grown oxide layer.

6. The semiconductor component of claim 4, wherein the third doped region is adjacent the third nitride spacer and further including a fourth doped region, the fourth doped region adjacent the fourth nitride spacer.

7. A semiconductor component having sidewall spacers, comprising:
   a semiconductor material having a gate structure disposed thereon, the gate structure having a top surface and first and second sides;
   a first oxide layer on the first side of the gate structure and a second oxide layer on the second side of the gate structure;
   a first nitride spacer in contact with the first oxide layer and a second nitride spacer in contact with the second oxide layer;
   a third nitride spacer adjacent the first nitride spacer; and
   a fourth nitride spacer adjacent the second nitride spacer.

8. The semiconductor component of claim 7, further including:
   a first doped region aligned to the first nitride spacer; and
   a second doped region aligned to the second nitride spacer.

9. The semiconductor component of claim 8, further including:
   a third doped region aligned to the third nitride spacer; and
   a fourth doped region aligned to the fourth nitride spacer.

10. The semiconductor component of claim 8, further including silicide formed from the top surface of the gate structure, a portion of the first side of the gate structure, and a portion of the second side of the gate structure.

11. The semiconductor component of claim 10, wherein the suicide is a suicide selected from the group of suicides consisting of cobalt suicide, titanium suicide, platinum suicide, and nickel suicide.

12. The semiconductor component of claim 7, further including a third oxide layer between the first and third nitride spacers and a fourth oxide layer between the second and fourth nitride spacers.

13. The semiconductor component of claim 7, wherein the first oxide layer and the second oxide layer each have a thickness ranging from 10 Angstroms to 60 Angstroms.

14. A semiconductor component, comprising:
   a semiconductor material having a major surface, the semiconductor material of a first conductivity type;
   a gate structure disposed on the major surface, the gate structure having a top surface and first and second sides;
   a first dielectric material disposed on a first portion of the first side of the gate structure;
   a second dielectric material disposed on a first portion of the second side of the gate structure;
   a first nitride spacer adjacent the first dielectric material;
   a second nitride spacer adjacent the second dielectric material;
   a third nitride spacer adjacent the first dielectric material; and
   a fourth nitride spacer adjacent the second nitride spacer.

15. The semiconductor component of claim 14, further including silicide formed from the top surface of the gate structure and from a second portion of the first side of the gate structure and a second portion of the second side of the gate structure, the first and second portions adjacent the top surface of the gate structure.

16. The semiconductor component of claim 14, further including oxide between the first and third nitride spacers.

17. The semiconductor component of claim 16, further including oxide between the second and fourth nitride spacers.

18. The semiconductor component of claim 14, further including first and second doped regions in the semiconductor material, the first doped region aligned to the first nitride spacer, the second doped region aligned to the second nitride spacer, and wherein the first and second doped regions are of a second conductivity type.

19. The semiconductor component of claim 18, further including third and fourth doped regions in the semiconductor material, the third doped region aligned to the third nitride spacer, the fourth doped region aligned to the fourth nitride spacer, and wherein the third and fourth doped regions are of a second conductivity type.

20. The semiconductor component of claim 14, wherein the first and second dielectric material are oxide.

* * * * *

UNITED STATES PATENT AND TRADEMARK OFFICE
CERTIFICATE OF CORRECTION

PATENT NO. : 6,933,620 B2
DATED : August 23, 2005
INVENTOR(S) : Scott Lunning et al.

It is certified that error appears in the above-identified patent and that said Letters Patent is hereby corrected as shown below:

Column 7,
Lines 40-43, each occurrence of "suicide" should read -- silicide --.

Signed and Sealed this

Eleventh Day of October, 2005

JON W. DUDAS
*Director of the United States Patent and Trademark Office*